United States Patent
Scandiuzzo et al.

(10) Patent No.: US 8,982,574 B2
(45) Date of Patent: Mar. 17, 2015

(54) CONTACT AND CONTACTLESS DIFFERENTIAL I/O PADS FOR CHIP-TO-CHIP COMMUNICATION AND WIRELESS PROBING

(75) Inventors: Mauro Scandiuzzo, Torrazza di Cambiago (IT); Luca Perilli, Teramo (IT); Roberto Canegallo, Rimini (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 182 days.

(21) Appl. No.: 13/479,957

(22) Filed: May 24, 2012

(65) Prior Publication Data

US 2012/0262231 A1     Oct. 18, 2012

Related U.S. Application Data

(63) Continuation-in-part of application No. 13/334,084, filed on Dec. 22, 2011.

(30) Foreign Application Priority Data

Dec. 29, 2010 (IT) .............................. TO2010A1079

(51) Int. Cl.
  *H05K 7/10* (2006.01)
  *H01L 23/48* (2006.01)
  (Continued)

(52) U.S. Cl.
  CPC .............. *H01L 23/48* (2013.01); *H01L 23/642* (2013.01); *H01L 25/0652* (2013.01); *H01L 25/0657* (2013.01); *H01L 25/50* (2013.01); *G01R 31/3025* (2013.01); *H05K 1/0239* (2013.01); *H01L 23/5223* (2013.01);
  (Continued)

(58) Field of Classification Search
  USPC .......... 361/767, 820; 257/668, 700, 701, 758; 600/407, 437
  See application file for complete search history.

(56) References Cited

U.S. PATENT DOCUMENTS 4,970,571 A  11/1990  Yamakawa et al.
5,477,933 A  12/1995  Nguyen
(Continued)

FOREIGN PATENT DOCUMENTS

EP  1359618 A2  11/2003
EP  2341626 A2  7/2011

OTHER PUBLICATIONS

Italian Search Report and Written Opinion dated Sep. 6, 2011 from Italian Application No. TO2010A001079.
(Continued)

*Primary Examiner* — Xiaoliang Chen
(74) *Attorney, Agent, or Firm* — Allen, Dyer, Doppelt, Milbrath & Gilchrist, P.A.

(57) ABSTRACT

Contactless differential coupling structures can be used to communicate signals between circuits located on separate chips or from one chip to a probing device. The contactless coupling structures avoid problems (breaks, erosion, corrosion) that can degrade the performance of ohmic-type contact pads. The contactless coupling structures comprise pairs of conductive pads placed in close proximity. Differential signals are applied across a first pair of differential pads, and the signals are coupled wirelessly to a mating pair of conductive pads. Circuitry for generating and receiving differential signals is described.

12 Claims, 10 Drawing Sheets

(51) Int. Cl.
*H01L 23/64* (2006.01)
*H01L 25/065* (2006.01)
*H01L 25/00* (2006.01)
*G01R 31/302* (2006.01)
*H05K 1/02* (2006.01)
*H01L 23/522* (2006.01)
*H01L 23/00* (2006.01)

(52) U.S. Cl.
CPC ............ *H01L 2224/16145* (2013.01); *H01L 2224/32145* (2013.01); *H01L 2224/48091* (2013.01); *H01L 2224/48227* (2013.01); *H01L 2225/06513* (2013.01); *H01L 2924/14* (2013.01); *H01L 2924/15192* (2013.01); *H01L 2924/19015* (2013.01); *H01L 2924/19041* (2013.01); *H01L 24/16* (2013.01); *H01L 24/17* (2013.01); *H01L 24/32* (2013.01); *H01L 24/48* (2013.01); *H01L 24/73* (2013.01); *H01L 2224/16227* (2013.01); *H01L 2224/1703* (2013.01); *H01L 2224/73207* (2013.01); *H01L 2225/0651* (2013.01); *H01L 2225/06517* (2013.01); *H01L 2924/00013* (2013.01); *H01L 2924/01079* (2013.01); *H01L 2225/06541* (2013.01); *H01L 2225/06531* (2013.01); *H05K 1/0243* (2013.01); *H05K 1/0245* (2013.01); *H05K 1/0259* (2013.01); *H05K 2201/0191* (2013.01); *H05K 2201/099* (2013.01); *H01L 2224/16225* (2013.01)
USPC .......... 361/767; 361/820; 257/668; 257/700; 257/701; 257/758; 600/407; 600/437

(56) References Cited

U.S. PATENT DOCUMENTS

| | | | |
|---|---|---|---|
| 6,005,777 A | 12/1999 | Bloom et al. | |
| 6,201,234 B1 * | 3/2001 | Chow et al. | 250/214 LS |
| 6,496,355 B1 | 12/2002 | Galvagni et al. | |
| 6,600,325 B2 | 7/2003 | Coates et al. | |
| 6,717,270 B1 * | 4/2004 | Downey et al. | 257/758 |
| 6,885,202 B2 | 4/2005 | Slupsky | |
| 6,927,490 B2 | 8/2005 | Franzon et al. | |
| 7,181,663 B2 | 2/2007 | Hildebrant | |
| 7,319,341 B1 | 1/2008 | Harms et al. | |
| 7,821,293 B2 | 10/2010 | Fazzi et al. | |
| 2001/0013814 A1 * | 8/2001 | Arisawa | 332/115 |
| 2002/0003304 A1 * | 1/2002 | Matsunaga et al. | 257/758 |
| 2003/0199255 A1 * | 10/2003 | Arisawa | 455/108 |
| 2005/0046037 A1 | 3/2005 | Franzon et al. | |
| 2006/0084859 A1 * | 4/2006 | Johnson et al. | 600/407 |
| 2006/0220759 A1 * | 10/2006 | Arisawa | 332/149 |
| 2006/0287596 A1 * | 12/2006 | Johnson et al. | 600/437 |
| 2006/0293597 A1 * | 12/2006 | Johnson et al. | 600/437 |
| 2007/0282200 A1 * | 12/2007 | Johnson et al. | 600/437 |
| 2007/0290302 A1 * | 12/2007 | Nakagawa et al. | 257/668 |
| 2008/0143379 A1 * | 6/2008 | Norman | 326/39 |
| 2008/0302431 A1 * | 12/2008 | Marchand et al. | 137/803 |
| 2009/0055019 A1 * | 2/2009 | Stiehl et al. | 700/249 |
| 2009/0157141 A1 * | 6/2009 | Chiao et al. | 607/46 |
| 2009/0168391 A1 * | 7/2009 | Saitou et al. | 361/820 |
| 2009/0189745 A1 | 7/2009 | Nakashiba | |
| 2010/0264954 A1 * | 10/2010 | Drost et al. | 326/30 |
| 2010/0289156 A1 * | 11/2010 | Iguchi et al. | 257/777 |
| 2011/0171906 A1 | 7/2011 | Canegallo et al. | |

OTHER PUBLICATIONS

"Capacitive Coupling and Quantized Feedback Applied to Conventional CMOS Technology"; IEEE Journal of Solid-State Circuits, vol. 32, No. 3, Mar. 1997.

"3 Gb/s AC Coupled Chip-to-Chip Communication Using a Low Swing Pulse Receiver"; IEEE Journal of Solid-State Circuits, vol. 41, No. 1, Jan. 2006.

* cited by examiner

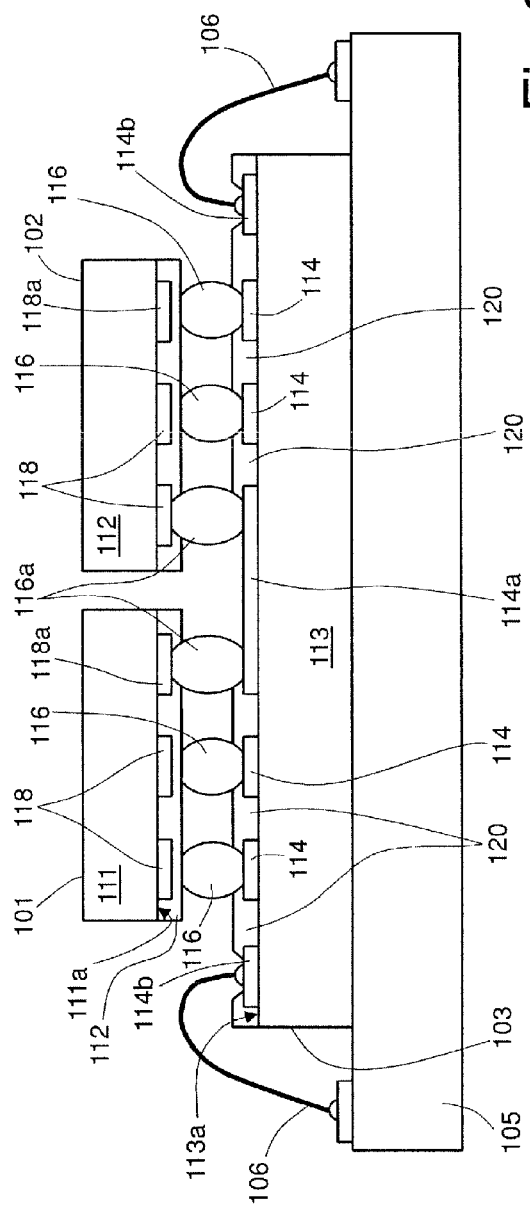
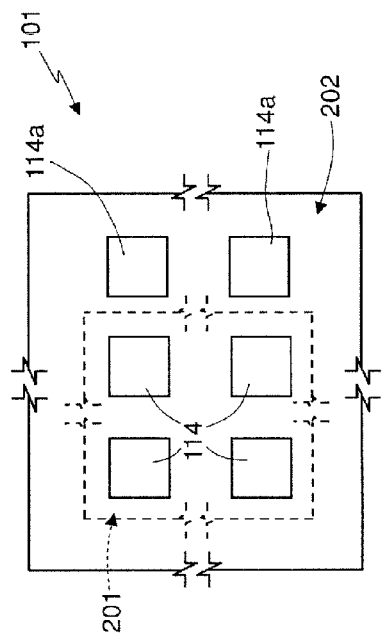

CONTACT AND CONTACTLESS DIFFERENTIAL I/O PADS FOR CHIP-TO-CHIP COMMUNICATION AND WIRELESS PROBING

CROSS REFERENCE TO RELATED APPLICATIONS

This application is a continuation-in-part of U.S. patent application Ser. No. 13/334,084, filed Dec. 22, 2011, which application claims the priority benefit of Italian patent application number TO2010A001079, filed on Dec. 29, 2010, both of which applications are hereby incorporated by reference to the maximum extent allowable by law.

BACKGROUND

1. Technical Field

Embodiments relate to a substrate assembly comprising ohmic contact and capacitive interconnections, and to a manufacturing method thereof.

2. Discussion of the Related Art

It is known to provide electrical connections of an ohmic type between a plurality of chips and/or between chips and a substrate. Said connections envisage the formation of protuberances or bumps, in particular solder bumps or pillar bumps, extending from respective facing portions of the chips and of the substrate. The electrical connections using bumps present numerous advantages as compared to electrical connections using wires (wire bonding), amongst which the possibility of enabling a considerable saving of area when packaging the chips.

For example, U.S. Pat. No. 5,477,933 describes an electronic device comprising a chip connected to a substrate using a plurality of bumps.

Each bump, for example made of Au—Ge and/or Pb—Sn, is arranged in direct electrical contact with respective connection regions formed on respective facing surfaces of the chip and of the substrate, and in this way forms a conductive interconnection.

However, with the increase in the factor of integration of electronic devices, in the last few years it has become increasingly difficult to provide a sufficient amount of high-performance interconnections, which are in particular able to transfer both power signals and information signals, above all high-frequency signals (for example, in the case of RFID devices, devices functioning at radiofrequency, etc.). To overcome these difficulties, devices have been proposed the interconnections of which use a coupling of a capacitive and/or inductive type. In this case, the ohmic connections used for transfer of information signals are replaced by capacitive connections, which enable an efficient transfer of AC signals. A capacitive connection can be made by forming conductive pads on the surfaces of the chips that are to be coupled, and then by arranging the chips so that the respective conductive pads face one another to form a capacitor. It is evident that, in order to maximize the performance, the distance between facing conductive pads should be controlled in a precise, reliable, and repeatable way. Furthermore, also the alignment between conductive pads that are to to communicate should be controlled.

To solve these problems, document No. US 2005/0046037 describes a first substrate and a second substrate provided with respective conductive pads configured for capacitive coupling. The first substrate moreover includes a recess in which a bump (in particular, a solder bump) is formed. The recess and the bumps are configured so that, when the second substrate is brought up to the first substrate coming into contact with the bump, all the conductive pads are separated from one another by a predetermined distance, in any case less than the thickness of the bump.

With reference to the capacitive interconnections described in document No. US 2005/0046037, the distance between the conductive pads of the facing substrates is determined jointly by the thickness of the bumps and by the depth of the recesses in which the bumps are formed. Possible process spread or non-uniformity of the manufacturing steps can lead to formation, on one the same substrate, of recesses having non-uniform depths and/or bumps having non-uniform thicknesses. Furthermore, to enable a sufficient degree of mechanical stability and support between coupled substrates, it may be necessary to form the bumps in a number much higher than what is effectively necessary for the transfer of information signals between substrates. In particular, in the case where the transfer of information signals were effected exclusively using the capacitive coupling between conductive pads, all the bumps would have the sole function of support and separation between conductive pads.

This results in a considerable waste of area of the substrates used, moreover complicating the manufacturing process thereof and increasing the costs thereof on account of the need to remove the substrate in a plurality of portions for providing the recesses in which the bumps are formed.

SUMMARY

An embodiment comprises a substrate assembly comprising capacitive interconnections, and a corresponding manufacturing method that will be able to overcome at least some problems of the known art.

According to embodiments, a substrate assembly comprising capacitive interconnections, and a corresponding manufacturing method are provided, as defined in the to annexed claims.

According to one embodiment, there is provided an assembly comprising, a first substrate, having a first surface, housing a first electrical-interconnection element and a second electrical-interconnection element at the first surface; a second substrate, having a second surface, housing a third electrical-interconnection element and a fourth electrical-interconnection element at the second surface, and provided with a dielectric layer extending on top of the third electrical-interconnection element; a first coupling element of conductive material, extending between the first electrical-interconnection element and the third electrical-interconnection element and at least partially aligned to the first electrical-interconnection element and to the third electrical-interconnection element; and a second coupling element of conductive material, extending between the second electrical-interconnection element and the fourth electrical-interconnection element, at least partially aligned to the second and to the fourth electrical-interconnection elements, the first coupling element being ohmically coupled to the first electrical-interconnection element and capacitively coupled to the third electrical-interconnection element, and the second coupling element being ohmically coupled to the second electrical-interconnection element and to the fourth electrical-interconnection element.

According to an embodiment, the first coupling element is arranged in contact with the first electrical-interconnection element and with a portion of the dielectric layer facing the third electrical-interconnection element.

According to an embodiment, the first coupling element and the second coupling element are bumps, in particular solder bumps or pillar bumps.

According to an embodiment, wherein the first, second, third, and fourth electrical-interconnection elements are pads of conductive material.

According to an embodiment, the first substrate houses a first integrated circuit connected to the first electrical-interconnection element, the second substrate houses a second integrated circuit connected to the third electrical-interconnection element, the first and second integrated circuits being capacitively coupled together by means of the first electrical-interconnection element, the first coupling element, and the third electrical-interconnection element.

According to an embodiment, the first integrated circuit includes a first controller configured for processing information data, and a first transceiver circuit connecting the first controller to the first electrical-interconnection element; and the second integrated circuit includes a second controller configured for processing information data, and a second transceiver circuit connecting the second controller to the third electrical-interconnection element.

According to an embodiment, the first and second transceiver circuits are formed in integrated form in the respective first and second substrates.

According to an embodiment, the first and second transceiver circuits are configured to enable communication in transmission and/or reception of information data in digital or analog format between the first and the second integrated circuits through the first electrical-interconnection element, the first coupling element, and the third electrical-interconnection element.

According to an embodiment, the first and second transceiver circuits are capacitive-coupling transceivers.

According to an embodiment, the second electrical-interconnection element is directly coupled to the first controller, and the fourth electrical-interconnection element is directly coupled to the second controller.

According to an embodiment, the first electrical-interconnection element and the first coupling element form a first capacitor plate, and the third electrical-interconnection element forms a second capacitor plate, the dielectric layer forming a dielectric disposed between the first and second capacitor plates.

According to an embodiment, the third electrical-interconnection element, the second coupling element, and the fourth electrical-interconnection element are configured for transferring a DC signal between the first and second substrates.

According to an embodiment, the first substrate further comprises a first plurality of electrical-interconnection elements housed at the first surface; the second substrate further comprises a second plurality of electrical-interconnection elements housed at the second surface, the dielectric layer extending on top of said second plurality of electrical-interconnection elements, said assembly further comprising a first plurality of coupling elements, each coupling element extending between an electrical-interconnection element and an electrical-interconnection element, and being ohmically coupled to the respective electrical-interconnection element and capacitively coupled to the respective electrical-interconnection element.

According to an embodiment, the first substrate further comprises a third plurality of to electrical-interconnection elements housed at the first surface; and the second substrate further comprises a fourth plurality of electrical-interconnection elements housed at the second surface, said assembly further comprising a second plurality of coupling elements, each coupling element of said second plurality of coupling elements extending between an electrical-interconnection element of the third plurality of electrical-interconnection elements and an electrical-interconnection element of the fourth plurality of electrical-interconnection elements, the coupling elements of the second plurality of coupling elements being ohmically coupled to an electrical-interconnection element of said third plurality of electrical-interconnection elements and ohmically coupled to an electrical-interconnection element of said fourth plurality of electrical-interconnection elements.

According to an embodiment, the first substrate and the second substrate are chosen from among: a substrate of a semiconductor chip; a substrate of a printed circuit; a substrate of a package for a microelectronic circuit.

According to an embodiment, there is provided a method for assembly of a first substrate and a second substrate, comprising the steps of: providing a first substrate; forming, at a first surface of the first substrate, a first electrical-interconnection element and a second electrical-interconnection element; providing a second substrate; forming, at a second surface of the second substrate, a third electrical-interconnection element, and a fourth electrical-interconnection element; forming, above the third electrical-interconnection element, a dielectric layer; forming a first coupling element of conductive material between the first and third electrical-interconnection elements, at least partially aligned to the first and third electrical-interconnection elements along a direction orthogonal to the first surface and the second surface; forming a second coupling element of conductive material between the second electrical-interconnection element and the fourth electrical-interconnection element, at least partially aligned to the second and fourth electrical-interconnection elements along a direction orthogonal to the first surface and to the second surface; coupling the first coupling element ohmically to the first electrical-interconnection element and capacitively to the third electrical-interconnection element; and ohmically coupling the second coupling element to the second interconnection element and to the fourth interconnection element.

According to an embodiment, the step of capacitively coupling the first coupling element to the second electrical-interconnection element comprises arranging the first coupling element in contact with the dielectric layer at a portion of the dielectric layer facing the second to electrical-interconnection element.

According to an embodiment, the steps of forming the first, second, third, and fourth electrical-interconnection elements comprise forming, respectively, a first conductive pad, a second conductive pad, a third conductive pad, and a fourth conductive pad.

According to an embodiment, the steps of forming the first and second coupling elements comprise forming a respective bump in contact with the first electrical-interconnection element and, respectively, with the second electrical-interconnection element.

According to an embodiment, the steps of coupling the first coupling element ohmically to the first electrical-interconnection element and capacitively to the third electrical-interconnection element, and the steps of ohmically coupling the second coupling element to the second electrical-interconnection element and to the fourth electrical-interconnection element comprise carrying out a thermal process at a temperature equal to or higher than the melting temperature of the first and second coupling elements.

According to an embodiment, the method further comprises the steps of forming, at the first surface, a first plurality of electrical-interconnection elements; forming, at the second surface, a second plurality of electrical-interconnection elements, the dielectric layer extending on top of the second plurality of electrical-interconnection elements; forming a first plurality of coupling elements between an electrical-interconnection element of said first plurality of electrical-interconnection elements and an electrical-interconnection element of said second plurality of electrical-interconnection elements; ohmically coupling each coupling element of said plurality of coupling elements to a respective electrical-interconnection element of said first plurality of electrical-interconnection elements; and capacitively coupling each coupling element of said plurality of coupling elements to a respective electrical-interconnection element of said second plurality of electrical-interconnection elements.

According to an embodiment, the method further comprises the steps of forming, at the first surface, a third plurality of electrical-interconnection elements; forming, at the second surface, a fourth plurality of electrical-interconnection elements; forming a second plurality of coupling elements between an electrical-interconnection element of said third plurality of electrical-interconnection elements and an electrical-interconnection element of said fourth plurality of electrical-interconnection elements; ohmically coupling each coupling element of said plurality of coupling elements to a respective electrical-interconnection element of said third plurality of electrical-interconnection elements and to a respective electrical-interconnection element of said fourth plurality of electrical-interconnection elements.

According to an embodiment, the method further comprises the steps of providing a first and a second controller configured for processing information data, providing a first and a second transceiver circuit, connecting the first controller to the first electrical-interconnection element by means of the first transceiver circuit, and connecting the second controller to the third electrical-interconnection element by means of the second transceiver circuit.

According to an embodiment, the step of providing the first and the second controller comprises integrating the first and the second controller within the first and, respectively, the second substrate.

According to an embodiment, the step of forming the second electrical-interconnection element comprises directly coupling the second electrical-interconnection element to the first controller, and the step of forming the fourth electrical-interconnection element comprises directly coupling the fourth electrical-interconnection element to the second controller.

The inventors have recognized that an interconnection between a selected circuit node on a first wafer or chip and circuitry on a second wafer, chip or probing device may be established with a pair of contactless differential pads. Additional circuitry may be incorporated on the first wafer to enable two-way communication between the selected node and circuitry on the second wafer or chip or circuitry connected to the probing device. Communication through the contactless differential pads may be via capacitive wireless coupling. In some embodiments, signal transmission quality for contactless differential pads is improved by about a factor of 10 over transmission quality for a single capacitive contactless pad. In some embodiments, an additional ohmic-type contact pad may be included with the contactless differential pair of pads for coupling a signal between circuitry on a chip and circuitry external to the chip.

The coupling structure, in some implementations, may comprise a first pair of contactless pads on a first wafer or chip and configured to transmit or receive differential signals applied to or incident on the pair of pads. The coupling structure may include an insulating layer extending over coupling surfaces of the first pair of pads. The coupling structure may further include a mating second pair of conductive pads located on a second wafer, chip or probing device. The second pair of conductive pads may be configured to be placed in close proximity to the first pair of contactless pads, but on an opposite side of the insulating layer. The coupling structure may further include circuitry configured to receive a to signal from the selected node and provide differential signals to the first pair of the contactless pads, as well as receive differential signals from the first pair of the contactless pads and provide a signal derived from the differential signals to circuitry on the first wafer or chip.

According to one embodiment, a coupling structure between a first node on a first wafer or chip and at least one second node or circuitry on a second wafer, chip or probing device comprises a first differential pad and a second differential pad arranged as a pair on a first substrate and an insulating layer extending across contact surfaces of the first and second differential pads. The coupling structure may further comprise circuitry connected to the first and second differential pads and configured to provide differential signals derived from a first signal to the first and second differential pads.

The coupling structure may further include a first mating differential pad located proximal the first differential pad, and a second mating differential pad located proximal the second differential pad. The first and second mating differential pads may be located on a side of the insulating layer opposite the first and second differential pads.

In some embodiments, the coupling structure further comprises an ohmic-type contact pad located on the first substrate and configured to receive a second signal representative of the first signal, and a mating ohmic-type contact pad in ohmic contact with the ohmic-type contact pad. The ohmic-type contact pad may be located on the first substrate, and the mating ohmic-type contact pad and mating differential pads may be located on a second substrate.

Embodiments of the invention also include a method for coupling a first signal from first circuitry on a first substrate to external circuitry. The method may comprise acts of receiving, at a first time and at an input node on the first substrate, a first signal from the first circuitry, and producing from the first signal a first pair of differential signals. The method may further include providing the first pair of differential signals to a pair of contactless differential pads located on the first substrate. According to some implementations, the method further comprises coupling the first pair of differential signals wirelessly to a mating pair of contact pads located on a second substrate placed in close proximity to the first substrate.

The foregoing and other aspects, embodiments, and features of the present teachings can be more fully understood from the following description in conjunction with the accompanying drawings.

BRIEF DESCRIPTION OF THE DRAWINGS

For a better understanding, embodiments are now described, purely by way of non-limiting example, with reference to the attached drawings, wherein:

FIG. 8 shows, in cross-sectional view, a 3D assembly of chips according to an embodiment;

FIG. 9 shows, in top plan view, a chip comprising pads arranged in a central portion and in a peripheral portion;

DETAILED DESCRIPTION

Figure 1:
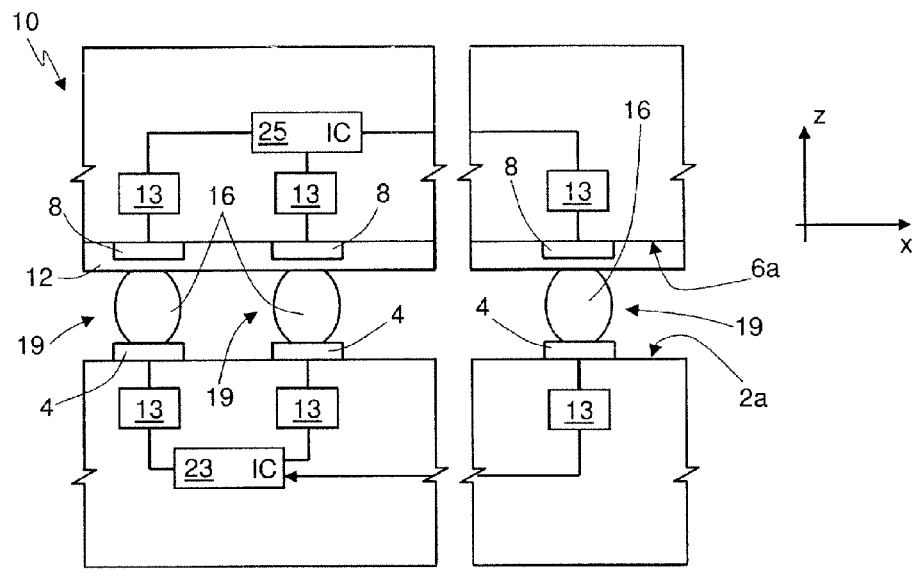
FIG. 1 shows, in cross-sectional view, an assembly of substrates capacitively coupled together, according to one embodiment.

FIG. 1 shows, in cross-sectional view, an assembly of two substrates according to an embodiment, forming, for example, an electronic device 10.

In detail, the electronic device 10 comprises a first substrate 2 and a second substrate 6, for example made of semiconductor material, such as silicon.

The first substrate 2 is provided with first conductive pads 4, formed on a surface 2a of the first substrate 2, and the second substrate 6 is provided with second conductive pads 8 formed on a surface 6a of the second substrate 6. FIG. 1 shows, by way of example, three first conductive pads 4 and three second conductive pads 8. It is evident that, according to the need, the first and second conductive pads 4, 8 can be in any number, higher or lower than three.

The second substrate 6 moreover includes a dielectric layer 12, formed on top of the surface 6a and on top of the second conductive pads 8. The dielectric layer 12 is, according to an embodiment, a passivation layer, for example made of silicon oxide, and has a thickness comprised between some hundreds of nanometers to some micrometers, for example 1 μm.

The first substrate 2 and the second substrate 6 are arranged with respect to one another so that the respective surfaces 2a and 6a face one another and the first pads 4 are at least partially aligned, in a vertical direction defined by the axis Z, to the respective second pads 8. In this way, respective first and second conductive pads 4, 8 face one another.

The first substrate 2 and the second substrate 6 are coupled by means of a plurality of coupling elements 16 made of conductive material, for example bumps, in particular solder bumps. The coupling elements 16 are, for example, made of metal, such as aluminum, copper, tin, lead, gold, or other metals still, or of a conductive alloy, for example gold/germanium (Au—Ge) or lead/tin (Pb—Sn) or tin/silver (Sn—Ag).

In particular, each coupling element 16 extends from each first conductive pad 4 (with which it is in electrical contact) until it contacts the dielectric layer 12 in a portion of the latter facing a respective second conductive pad 8.

Each first conductive pad 4 is consequently at least partially aligned, in the direction of the axis Z, to a respective coupling element 16 and to a respective second pad 8.

In detail, each first conductive pad 4 is in electrical contact with a respective coupling element 16, which is capacitively coupled to a respective second conductive pad 8. A capacitive interconnection 19 is thus formed, which can be represented schematically as a capacitor in which one capacitor plate is formed by the ensemble of a first pad 4 and of a coupling element 16, and the other capacitor plate is formed by a second pad 8. The dielectric to extending between the plates of the capacitor is a portion of the dielectric layer 12 comprised between the coupling element 16 and the respective second conductive pad 8.

A capacitive coupling between each first pad 4 and a respective second pad 8 is thus formed.

The first and second substrates 2, 6 further comprise one or more receiver and transmitter circuits 13, each of which is electrically coupled to a respective conductive pad 4, 8 and is formed, for example, in integrated form in the respective first and second substrates 2, 6.

Each receiver and transmitter circuit 13 is a circuit of a known type, configured to enable communication in transmission and/or reception of information data (in digital or analog format) between the conductive pads 4, 8.

Each receiver and transmitter circuit 13 may be of a type configured to act both in transmission and in reception (also known as transceiver). A receiver and transmitter circuit 13 of this type may be, for example, of the type disclosed in US 2011/0171906.

Alternatively, some circuits 13 may be configured to act in transmission only, and other circuits 13 may be configured to act in reception only. The choice depends upon the particular application and use. It is evident that, if a certain circuit 13 integrated within the first substrate 2 is configured as a transmitter only, the circuit 13 integrated within the second substrate 6, and capacitively coupled with the transmitter circuit 13, is configured as a receiver, and vice versa. An interconnection system of this type is for example described in U.S. Pat. No. 7,821,293.

According to an embodiment, all the circuits 13 housed by the first substrate 2 are configured as transmission circuits; all the circuits 13 housed by the second substrate 6 are configured as receiving circuits. According to a further embodiment, all the circuits 13 housed by the first substrate 2 are configured as receiving circuits; all the circuits 13 housed by the second substrate 6 are configured as transmission circuits.

The first substrate 2 further comprises an electronic controller 23, e.g., formed in an integrated form within the substrate 2, connected to the conductive pads 4 via respective receiver and transmitter circuits 13, and configured for managing the information data exchanged between the conductive pads 4 and the conductive pads 8.

Likewise, also the substrate 6 comprises a respective electronic controller 25, connected to the conductive pads 8 via respective receiver and transmitter circuits 13, and configured for managing the information data exchanged between the conductive pads 4 and to the conductive pads 8. The integrated circuits 23, 25 can in this way exchange information data via the capacitive coupling formed between the conductive pads 4 and the conductive pads 8.

Thanks to the presence of the dielectric layer 12, it is not necessary to provide the receiver and transmitter circuit 13 with diodes for protection from electrostatic discharge (ESD diodes).

The electronic controller 23 is configured to process information data received by the electronic controller 25, and/or to process information data to be sent to the electronic controller 25. Analogously, the electronic controller 25 is configured to process information data received by the electronic controller 23, and/or to process information data to be sent to the electronic controller 23. Information data are exchanged, for example in a digital format, through the receiver and transmitter circuits 13 coupled to the respective electronic controllers 23, 25. The receiver and transmitter circuits 13 housed by the first substrate 2 and the receiver and transmitter circuits 13 housed by the second substrate 6 are capacitive-coupling transceivers (as said, of a known type), allowing capacitive data exchange among them. Each receiver and transmitter circuit 13 of the first substrate 2 is thus configured to capacitively receive/transmit data from/to a respective receiver and transmitter circuits 13 of the second substrate 6, through respective conductive pads 4, 8 and coupling elements 16. Communication of data between electronic controllers 23 and 25 is, in this way, guaranteed.

Figure 2A:
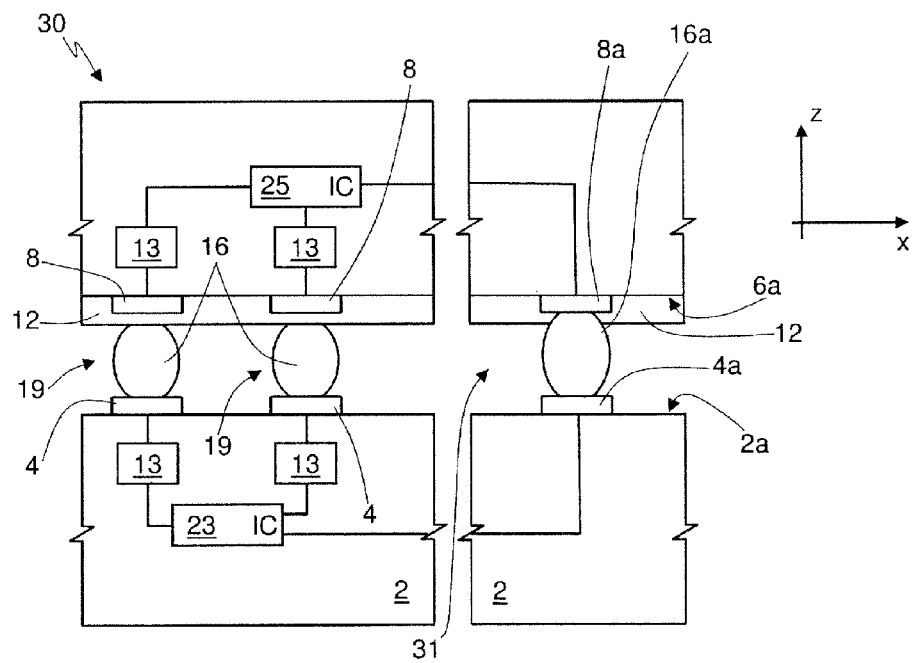
FIG. 2a shows, in cross-sectional view, an assembly of substrates coupled together capacitively and ohmically, according to another embodiment.

FIG. 2a shows, in cross-sectional view, an assembly of two substrates according to a further embodiment. The assembly of FIG. 2a forms, for example, an electronic device 30.

The electronic device 30 is similar to the electronic device 10 of FIG. 1 (elements that are in common are not described any further and are designated in the figure by the same reference numbers), and comprises, in addition to the capacitive interconnections 19, an ohmic interconnection 31. It is evident that the number of capacitive interconnections 19 and ohmic interconnections 31 can be different from the one shown in FIG. 2a. In particular, there may be present capacitive interconnections 19 in a number higher or lower than two, and ohmic interconnections 31 in number higher than one.

The ohmic interconnection 31 is formed by means of a coupling element 16a similar to the coupling elements 16, for example a conductive bump (of the solder-bump type). The coupling element 16a extends between a first conductive pad 4a (similar to the first conductive pads 4) and a respective second conductive pad 8a (similar to the second conductive pads 8), to which faces the first conductive pad 4a and is aligned thereto in a direction parallel to the axis Z. The coupling element 16a is in ohmic contact both with the first conductive pad 4a and with the second conductive pad 8a, and can be used for transfer of information signals and/or for transfer of direct current (DC) biasing signals, and/or for transfer of the supply between the first and second substrates 4, 6. For this purpose, a connection may be provided between the electronic circuits 23, 25 via the coupling element 16a.

Figure 2B:
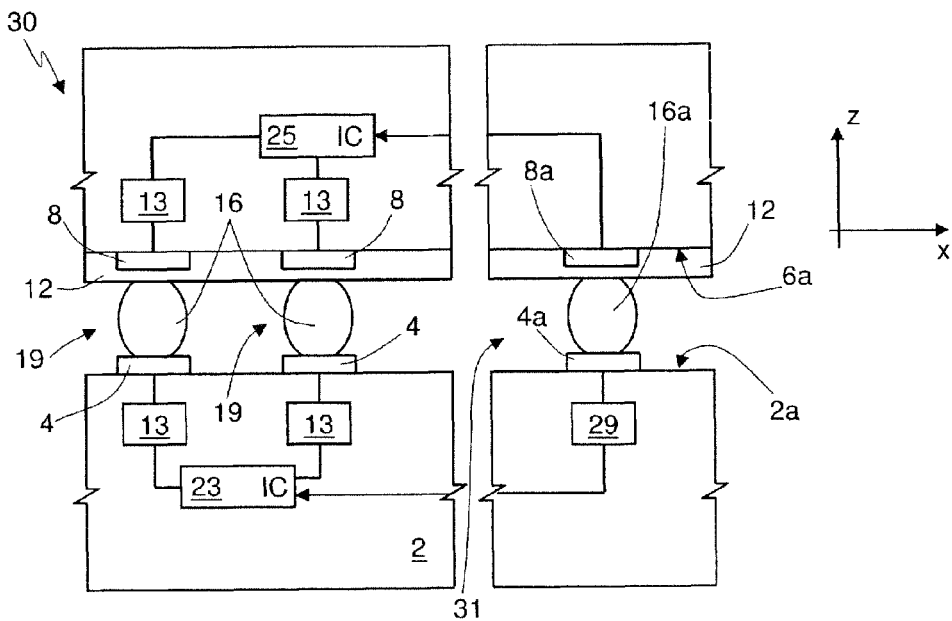
FIG. 2b shows, in cross-sectional view, an assembly of substrates coupled together capacitively, according to a further embodiment.

According to an embodiment, as shown in FIG. 2b, some capacitive interconnections 19 may be used for communication of information data using alternate current (AC) signals, and at least one capacitive interconnection 32 may be used for supplying power. The first substrate 2 further comprises a power supply 29, formed in integrated form in the first substrate 2, configured for supplying the electronic controller 23 and the electronic controller 25. Supply to the electronic controller 25 may be provided via the capacitive interconnection 31.

Alternatively, the power supply 29 may be external to the first substrate 2 and to the second substrate 6. With reference to FIGS. 3a, 3b, 4-6, there are now described process steps for the manufacture of the assembly that forms the electronic device 30 of FIG. 2a (or 2b).

Figure 3A:
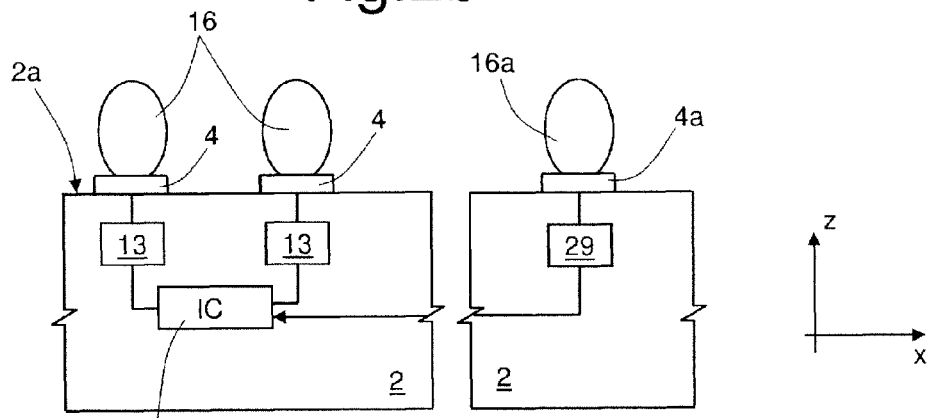
FIGS. 3a, 3b, and 4-6 show steps of formation of the assembly of FIG. 2a or FIG. 2b.
Figure 3B:
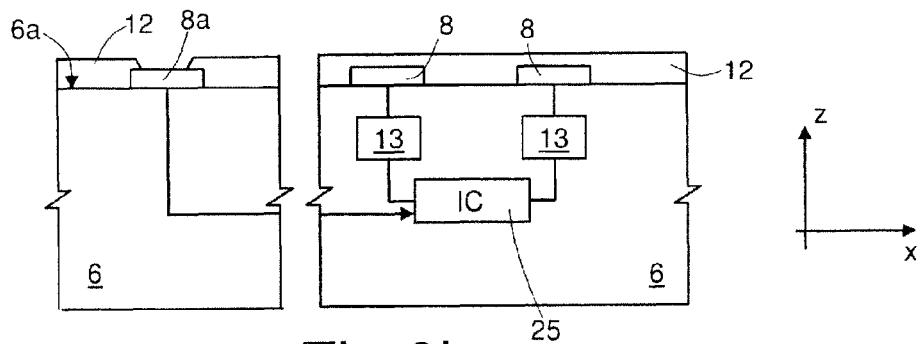
Figure 4:
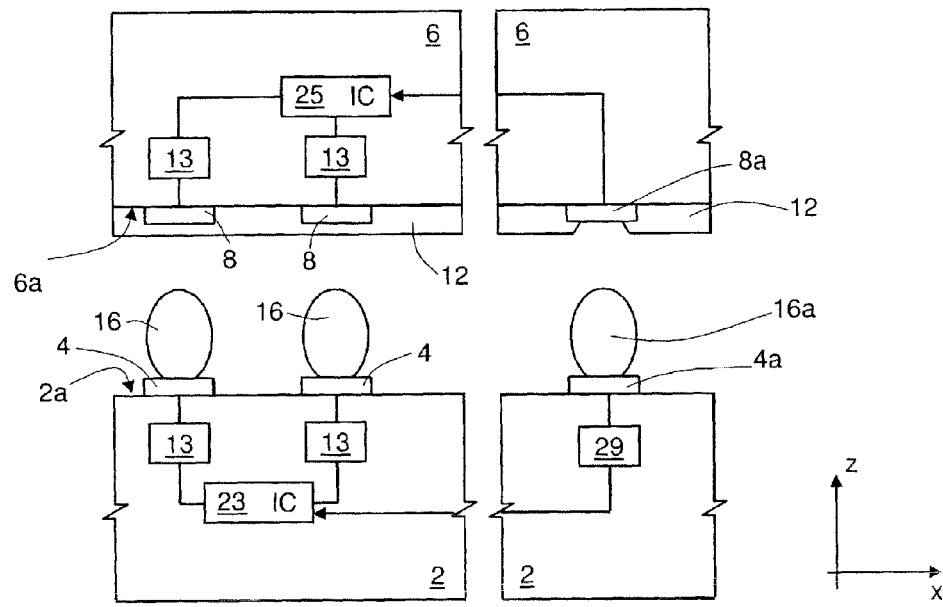
Figure 5:
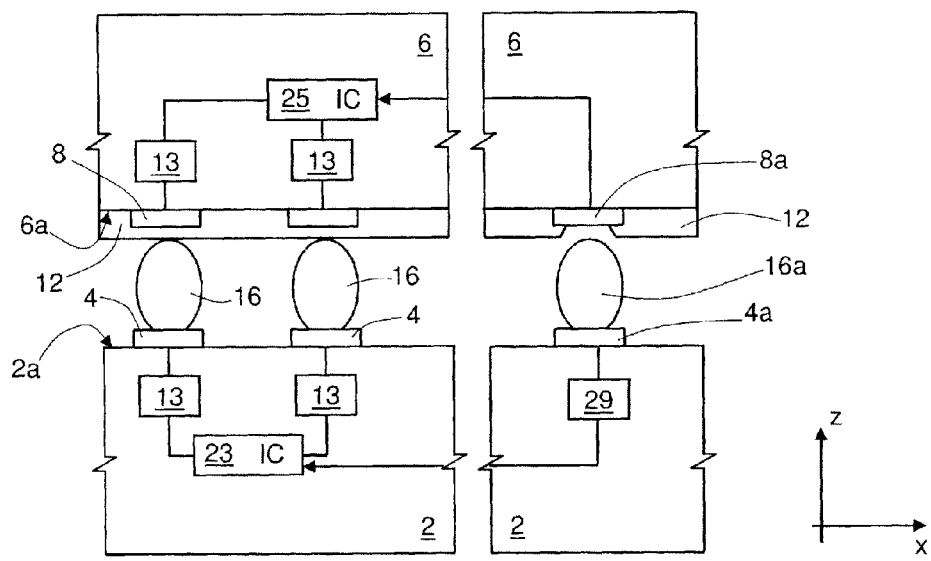

FIGS. 3a and 3b show the first and second substrates 2, 6 at the end of respective machining steps. In this step, the first and second substrates 2, 6 are substrates machined independently of one another, and in particular comprising a plurality of layers of materials deposited and/or grown, according to known micromachining techniques. The surfaces 2a and 6a are consequently the surfaces resulting at the end of respective steps of machining of the substrates 2, 6. In particular, the surfaces 2a, 6a comprise respective conductive pads 4, 4a, 8, 8a, arranged in such a way as to enable interconnection of the substrates 2, 6 as described previously with reference to FIG. 2a.

It is evident that the substrates 2, 6 can be, indifferently, semiconductor substrates of respective chips, or substrates of printed circuit boards (PCBs), or again, package substrates designed to carry a chip provided with bump connections and coupled to the chip via the bumps themselves, or the like.

The second substrate 6 comprises, as has been said, a dielectric layer 12 formed on the second conductive pads 8 but not on the second conductive pad 8a.

The first substrate 2 houses, in a position corresponding to the first conductive pads 4, the coupling elements 16, and, in a position corresponding to the first pad 4a, the coupling to element 16a. The coupling elements 16, 16a are, according to one embodiment, metal bumps (solder bumps or pillar bumps) that are the same as one another and formed in one and the same process step.

Techniques for formation of bumps are known in the literature, for example from U.S. Pat. No. 5,477,933.

Then (FIG. 4), the first and second substrates 2, 6 are arranged with the respective surfaces 2a and 6a facing one another (flip-chip technique) so that the second conductive pads 8, 8a are aligned, along the axis Z, with the coupling elements 16 and 16a, respectively.

Then (FIG. 5), the second substrate 6 is brought up to the first substrate 2 (or vice versa) so that the coupling elements 16 are arranged in contact with the dielectric layer 12. In this step, the coupling element 16a might not be in contact with the respective second conductive pad 8a on account of the thickness of the dielectric layer 12.

Finally (FIG. 6), the first and second substrates 2, 6 are arranged in an environment having, for example, a temperature slightly higher than the temperature of melting of the coupling elements 16 and 16a, and such as to cause a partial melting of the coupling elements 16 and 16a (also known as "reflow"). Generally, for coupling elements 16, 16a made of Pb—Sn, the melting temperature is approximately 310° C.

During the reflow step a partial realignment and rearrangement of the first and second substrates 2, 6 is generated, which, as a result of the partial melting of the coupling elements 16 and 16a, approach along the axis Z, thus reducing the relative distance between the surfaces 2a, 6a. In this way, also the coupling element 16a contacts the second conductive pad 8a.

The applicant has verified that, since the thickness of the dielectric layer 12 is small (as has been said, for example 1 μm), the mutual rearrangement between the substrates 2, 6 during the reflow step is sufficient to fill the distance possibly present between the coupling element 16a and the second conductive pad 8a.

What has been said applies in general also in the case where, owing to process spread, some of the coupling elements 16 have a thickness smaller than other coupling elements 16. The mutual rearrangement of the substrates 2, 6 during the reflow step also enables good contact to be obtained between the coupling elements 16 and the dielectric layer 12.

Clearly, the temperature and the duration of the reflow step is accurately controlled, as is known from the prior art, and none of the coupling elements 16 melts completely.

Figure 6:
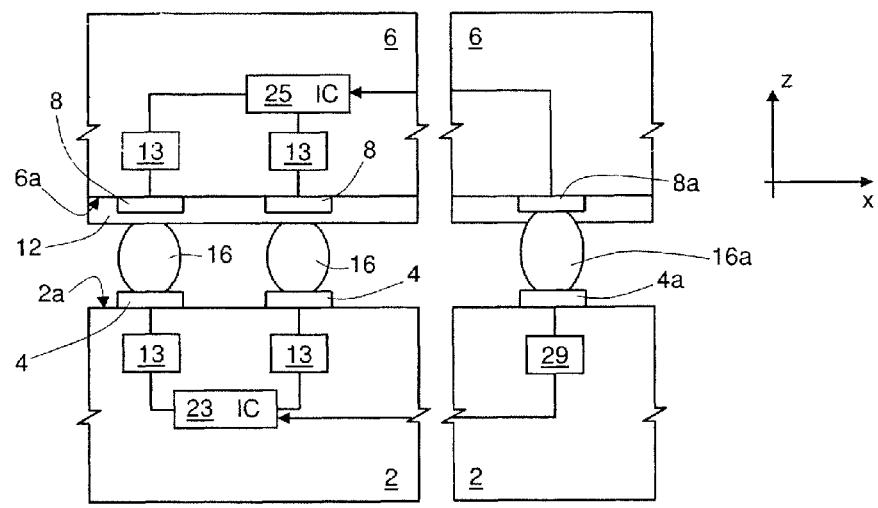

As an alternative to what has been described with reference to the steps of FIG. 6, the to thermal process can be replaced by or associated with a process of pressure bonding.

The electronic device of FIG. 2a is thus formed.

Figure 7:
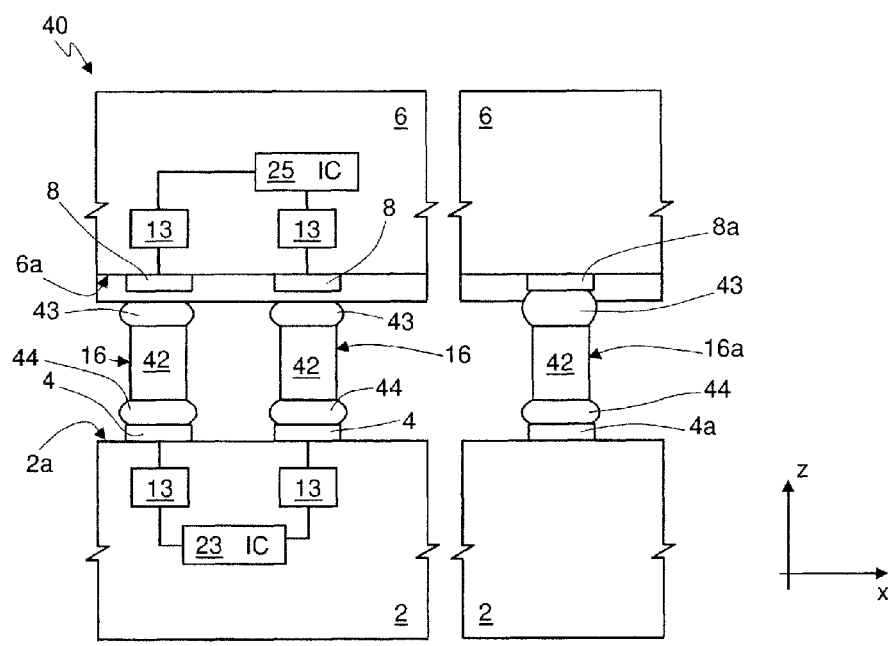
FIG. 7 shows, in cross-sectional view, an assembly of substrates coupled together capacitively and ohmically, according to a further embodiment.

FIG. 7 shows an electronic device 40 according to a further embodiment.

According to the embodiment of FIG. 7, the coupling elements 16 (and the coupling element 16a when present) are pillar bumps. Elements common to the embodiments of FIG. 1 and FIG. 2a are not described any further and are designated by the same reference numbers.

The coupling elements 16, 16a in the form of pillar bumps comprise a bearing structure 42, typically made of copper, having a thickness of some tens of micrometers, at the opposite ends of which coupling regions 43 and 44 are formed, typically of a lead/tin or tin/silver alloy or UBM (under bump metallization). The coupling regions 43, 44 are designed to promote adhesion (typically by means of welding) of each coupling element 16, 16a with the first and second conductive pads 4, 4a, 8, 8a. During the reflow step, as described previously with reference to FIG. 6, the coupling regions 43, 44 melt in a controlled way so as to enable a reduction of the distance that separates the surfaces 2a and 6a along the axis Z such as to bring the coupling elements 16 into direct contact with the dielectric layer 12 and the coupling element 16 to the second metal pad 8a. Melting moreover has the purpose of promoting adhesion between the coupling regions 43, 44 and the conductive pads 4, 4a, 8a with which they are in contact, as well as providing good capacitive coupling between the coupling regions 43 and the dielectric layer 12.

An advantage of using pillar bumps instead of solder bumps lies in the fact that, as is known, it is possible to form pillar bumps having relative lateral distance (along the axis X) smaller than the distance required by the solder bumps. The pillar bumps present, however, the disadvantage of requiring more complex manufacturing steps and generating parasitic capacitors between adjacent pillar bumps having parasitic capacitance higher than what occurs in the case of solder bumps.

As shown in FIG. 8, the assembly finds application in the 3D integration of chips. For example, FIG. 8 shows a first chip 101, a second chip 102, and a third chip 103 capacitively coupled together by means of a plurality of coupling elements of the type described previously. Furthermore, the chips 101-103 comprise one or more coupling elements designed to form an ohmic electrical coupling, for example for electrical supply of the chips 101-103.

To protect the surfaces facing one another of each chip 101-103, the chips 101-103 comprise a respective passivation layer, extending all over the surface of the chips 101-103 except for the conductive pads, where a coupling of an ohmic type is envisaged.

In detail, the chip 101 comprises a semiconductor substrate 111 having a surface 111a and housing a plurality of conductive pads 118, 118a in a position corresponding to the surface 111a. Moreover extending on the surface 111a is a passivation layer 112, made of dielectric material, having a thickness, for example, of 1 μm. The passivation layer 112 covers the conductive pads 118 but not the conductive pad 118a. The conductive pads 118 are configured to enable a capacitive coupling between the chip 101 and the chip 103, whereas the conductive pad 118a is configured to enable an ohmic coupling between the chip 101 and the chip 103.

The substrate 111, in a way similar to what has already been described with reference to the substrate 6 of FIGS. 1, 2a, 2b, can comprise a plurality of integrated electronic circuits, connected to each conductive pad 118 to enable reception and/or transmission of information signals in capacitive mode, and a supply circuit, connected to the conductive pad 118a for picking up the supply signal.

The chip 103 comprises a substrate 113, for example made of semiconductor material, housing, in a position corresponding to a surface 113a, a plurality of conductive pads 114, 114a, 114b. Moreover extending on the surface 113a of the substrate 113 is a passivation layer 120, for protecting the surface 113a. The passivation layer 120 leaves the conductive pads 114, 114a, 114b exposed.

As has been described with reference to the chip 101, also the substrate 113 comprises a plurality of integrated electronic circuits, connected to each conductive pad 114 to enable reception and/or transmission of information signals, and an electrical-supply circuit.

The chips 101 and 103 are arranged with respect to one another so that the respective surfaces 111a, 113a face one another.

The coupling between the chip 101 and the chip 103 is provided by means of a plurality of coupling elements 116, 116a, for example solder bumps, as described with reference to FIGS. 3-6.

The coupling elements 116 extend between each conductive pad 114 of the chip 103 up to the passivation layer 112 of the chip 101, in ohmic electrical contact with the pad 114 and in contact with a portion of the passivation layer 112 where a respective conductive pad 118 of the chip 101 extends. In this way, each conductive pad 114 is capacitively coupled to a to respective conductive pad 118 via the coupling element 116.

The coupling element 116a extends between the conductive pad 114a of the chip 103 and the conductive pad 118a of the chip 101, in ohmic electrical contact both with the conductive pad 114a and with the conductive pad 118a. The coupling element 116a can be used both for transfer of information signals and for electrical supply.

The third chip 103 is moreover arranged on a substrate 105, for example a substrate 105 of a package (not shown). The third chip 103 is electrically connected to the substrate 105 by means of wire bonding 106, extending between the conductive pads 114b and respective conductive pads of the substrate 105.

Alternatively, in a way not shown in the figure, also the third chip 103 and the substrate 105 can be capacitively coupled and/or electrically coupled to one another by means of coupling elements of a solder-bump or pillar-bump type. In this case, the third chip 103 has a plurality of through-silicon vias (TSVs), designed to form a connection between opposite faces of the chip 103, rendering 3D integration of the chips particularly compact.

The second chip 102 is provided with a semiconductor substrate 112 of its own, and is connected to the third chip 103 in a way similar to what has been described with reference to the first chip 101, and will hence not be described any further.

FIG. 9 shows, in schematic form and in top plan view, conductive pads 114, 114a arranged in a position corresponding to the surface 111a of the chip 101. However, what has been said here applies to all the chips 101-103.

With reference to FIG. 9, the chip 101 comprises a central portion 201 surrounded by a peripheral portion 202. In particular, one or more conductive pads can be arranged within the central portion 201, and be in any case easily accessible by means of capacitive connection. Other pads can be arranged in a position corresponding to the peripheral portion 202. The possibility of using the central portion 201 proves particularly advantageous in chips or integrated circuits of a pad-limited type, in which the number of conductive pads that can be provided in the peripheral portion 202 of the chip 101 is limited.

Figure 10A:
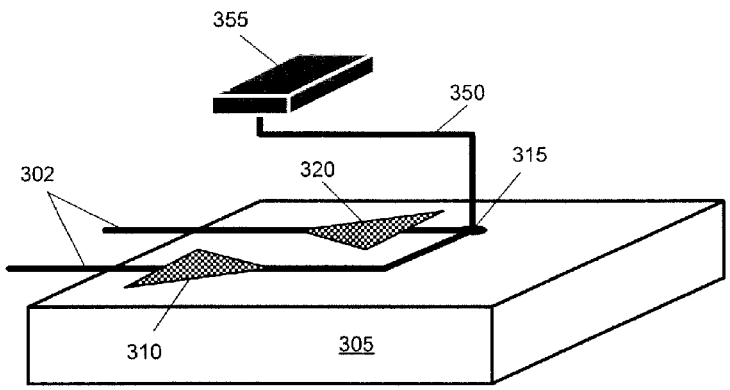
FIG. 10A depicts a coupling structure having a single ohmic-type contact pad.

FIG. 10A depicts an embodiment of an ohmic-type contact pad 355 that may be used for chip-to-chip interconnection, or used as a contact pad for a probing device. Contact pad 355 may be connected to a first node 315 of an integrated circuit formed on a semiconductor substrate 305. The substrate may be a chip or wafer. The integrated circuit may include an input amplifier 310 configured to receive and amplify a signal of interest from the integrated circuit and provide the signal to node 315. For example, the received signal may be a signal of interest for which probing is desired to evaluate whether the integrated circuit is functioning properly, or may be a signal that is to be sent to a second wafer or chip via contact 355 for further processing. The integrated circuit may further include an output amplifier 320 configured to amplify any signal (e.g., either the received signal of interest or a signal received from contact pad 355) and provide the amplified signal to an integrated circuit on the semiconductor substrate 305.

As described above, the contact structure shown in FIG. 10A is susceptible to interconnection failures at the contact pad 355. For example, connection breaks, pad erosion or pad corrosion may lead to failure or significant signal degradation at the pad. In turn, signal degradation may lead to failure of integrated circuitry on the substrate 305.

Figure 10B:
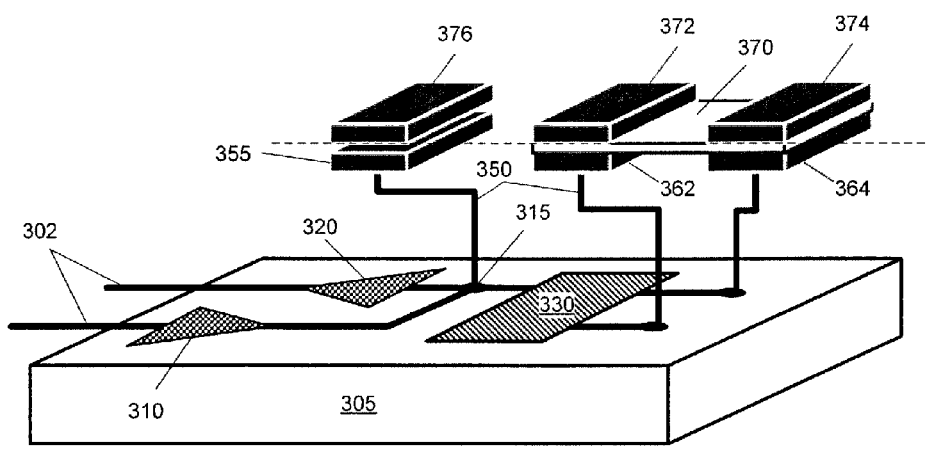
FIG. 10B depicts a coupling structure comprising a pair of contactless differential pads and associated circuitry, according to one embodiment.

FIG. 10B illustrates one embodiment of a contactless bidirectional coupling structure that may be used to enable communications of signals between circuitry on a first substrate 305 and circuitry on a second substrate or probing device (e.g., located above the dashed line, but not shown). In various embodiments and in overview, the coupling structure comprises a pair of contactless differential pads 362, 364 connected to integrated circuitry 310, 320, 330 (and optionally other circuitry not shown) on the first substrate 305. The differential pads may be connected to the integrated circuitry via interconnects 350. The coupling structure may further comprise an insulating layer 370 extending across coupling surfaces of the contactless differential pads 362, 364. The differential pads may be configured to be placed in close proximity (e.g., opposite the insulating layer) to a mating pair of conductive pads 372, 374 or probes.

As may be appreciated, the coupling structure shown in FIG. 10B permits use of contactless differential signaling between separate substrates or a substrate and probing device. The inventors have found that differential signaling using contactless dual pads and apparatus like those described in FIGS. 10B-12 can reduce parasitic capacitances associated with contactless coupling structures. For example, the inventors have found that for substantially equal signal quality, the parasitic capacitance for the dual-pad differential coupling structure such as that shown in FIG. 10B can be significantly less than parasitic capacitance for a single contactless coupler described in FIG. 1 above, for example. Further, the inventors have found that the dual contactless coupler provides improved signal coupling as compared to a single contactless coupler of substantially equivalent size and separation. For example, in to preliminary experiments, the inventors found for a single contactless coupler with coupling surfaces of conductive pads spaced about 2 to about 3 microns apart, a minimum detectable signal level required about a 50 millivolt (mV) peak-to-peak signal applied to the coupler. For a pair of contactless differential pads spaced the same distance, the inventors found the minimum detectable signal level to be about 5 mV peak-to-peak. This represents roughly a ten-fold improvement in signal strength.

Returning now to FIG. 10B, in some embodiments, the coupling structure may also comprise an ohmic-type contact pad 355 configured to be placed in direct contact with a mating conductive pad 376 or probe. In some implementations, contact pad 355 and conductive pad 376 may be joined by a solder bump or solder pillar as described above. According to some embodiments, conductive pad 376 may be located on a redistribution wafer, e.g., an interposer, that may be used in conjunction with a wafer tester for the purposes of testing circuitry on the substrate 305. According to some embodiments, conductive pads 372, 374 may be located on a redistribution wafer, e.g., an interposer, that may be used in conjunction with a wafer tester for the purposes of testing circuitry on the substrate 305.

The contactless pair of differential pads 362, 364 and the contact pad 355 may be formed on the semiconductor substrate 305, and may be made of any suitable conductive material (e.g., aluminum, gold, tungsten, nickel, silicon, polysilicon, germanium, chrome, titanium, or combinations and alloys thereof). The thickness of the differential pair of pads and contact pad may be any value between about 50 nanometers (nm) and 50 microns (μm). According to some embodiments, the thickness of the differential pair of pads is between about 200 nm and about 10 μm. The lateral dimensions of each differential pad may have any value between about 100 nm and about 10 μm. In some embodiments, the lateral dimensions of each differential pad is between about 500 nm and about 2 μm. The differential pads 362, 364 and the contact pad 355 may be formed during a same microlithography step, e.g., etched or deposited.

In some implementations, any of the contactless pair of differential pads 362, 364, the contact pad 355, and mating pair of conductive pads 372, 374 may comprise a solder bump or solder pillar formed into a parallel-plate capacitive structure. For example, a solder bump or solder pillar may be heated and formed at bonding time into a shape having a flat surface that faces a mating pad or solder bump or pillar. The flat surface may act as one plate of a parallel-plate capacitive structure.

The insulating layer 370 may be made of any suitable material (e.g., oxide, nitride, etc.), and may be deposited on the substrate 305 over the differential pair of pads 362, 364. The insulating layer can increase the dielectric constant between the pair of differential pads and mating pair of conductive pads. In some embodiments, the insulating layer may be patterned such that it is limited in lateral spatial extent to one or more regions that is/are approximately the size of the differential pads 362, 364. According to some implementations, the insulating layer 370 may comprise part (in terms of area and/or thickness) of a passivation layer. In some embodiments, the insulating layer may not be formed on the first substrate 305. Instead, the insulating layer 370 may be formed on the second substrate or a probing device that is placed in close proximity to the first substrate. In yet other embodiments, insulating layers may be formed on both the first substrate and second substrate or probing device.

In various embodiments, there may be integrated electronic circuitry disposed on the substrate 305 and connected to a node 315 for which signal probing, extraction, or input is desired. The integrated circuitry may or may not include an input amplifier 310 that is configured to amplify a signal received from another part of the electronic circuitry incorporated on the substrate 305. The integrated circuitry may or may not include an output amplifier 320 that is configured to amplify a signal provided to another part of the electronic circuitry incorporated on the substrate 305. Though only one node 315 is shown in the drawing, there may be a plurality of nodes connected to integrated circuitry on the substrate for which signal probing, extraction, or input is desired. Each node may have a pair of contactless differential pads associated with it.

In some embodiments, the integrated circuitry includes differential signal circuitry 330 that is configured to receive a first signal and provide differential signals to the pair of differential pads 362, 364. In some embodiments, input amplifier 310 and output amplifier 320 may be included with differential signal circuitry 330.

Figure 11:
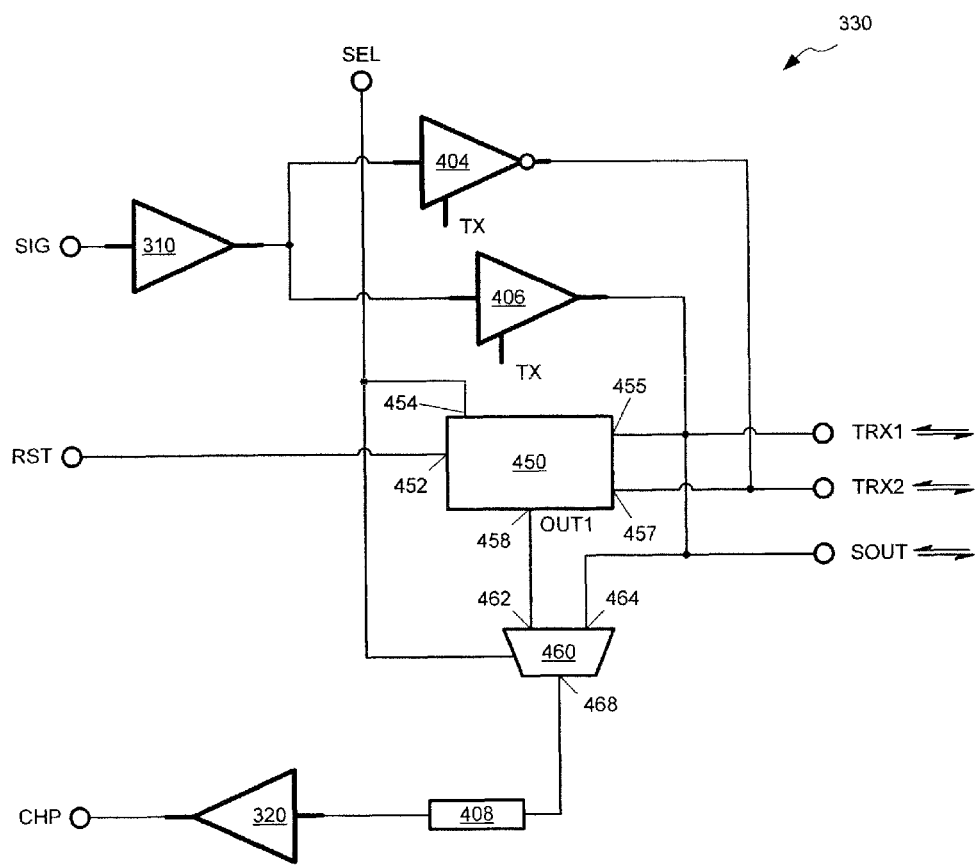
FIG. 11 shows one embodiment of circuitry configured to provide differential signals to and receive differential signals from a pair of contactless differential pads.

FIG. 11 depicts one embodiment of differential signal circuitry 330, which may be configured to receive signals from integrated circuitry on the substrate 305 and provide signals to the coupling structures, e.g., to pads 362, 364 and 355. The differential signal circuitry 330 may also be configured to receive signals from the coupling structures and provide signals to the integrated circuitry on the substrate 305. The differential signal circuitry may or may not include input amplifier 310 and output amplifier 320. The differential signal circuitry may further comprise an inverting amplifier 404, a non-inverting amplifier 406, a receiver 450, a to multiplexor 460, and a filter, fuse, automatic gain control, or resistive element 408.

Input and output amplifiers 310, 320 may be any suitable type of signal amplifier, (e.g., line drivers, unity-gain non-inverting amplifiers, unity-gain inverting amplifiers, low gain inverting or non-inverting amplifiers, op-amps, etc.) The output of the input amplifier 310 may be connected to an inverting amplifier 404 in a first circuit branch and to a non-inverting amplifier 406 in a second circuit branch parallel to the first branch. The inverting amplifier 404 and non-inverting amplifier 406 may provide differential signals that are applied to signal transceiving nodes TRX1 and TRX2. These nodes may be connected to the differential pair of pads 362, 364. According to one embodiment, a signal received at input node SIG is amplified and split into two signals, one inverted with respect to the other, that are applied to the signal transceiving nodes TRX1 and TRX2. Output from the non-inverting amplifier 406, or in other embodiments from inverting amplifier 404, may also be connected to a signal transceiving node SOUT. Node SOUT may be connected to the ohmic-type contact pad 355.

The inverting amplifier 404 and non-inverting amplifier 406 may be activated or de-activated by a control signal TX applied to a control node of each amplifier. According to one embodiment, when control signal TX is high, amplifiers 404 and 406 are in an active amplifying state, and when control signal TX is low, amplifiers 404 and 406 are inactive. It will be appreciated that the polarity of control signals may be reversed in some embodiments.

Differential signal circuitry 330 may further include a receiver 450 configured to receive differential signals at inputs 455, 457 and output to output node OUT1 458 a signal derived from the received differential signals. In some embodiments, the receiver 450 may include a reset input 452 connected to a reset node RST. The receiver may be activated and de-activated via a control input 454 that may be connected to a control node SEL. A control signal to activate or deactivate the receiver may be applied to the control input 454 via the control node SEL.

The differential signal circuitry 330 may further include a multiplexor 460 configured to pass a selected signal from among two signals applied to the multiplexor's signal inputs 462, 464. The selected signal may be passed to an output 468 of the multiplexor, which may be connected to an element 408 (e.g., a resistor, filter, fuse, etc.) and an output amplifier 320. The multiplexor 460 may receive at a first input 462 a signal from receiver 450, and may receive at a second input 464 a signal from non-inverting amplifier 406 or from signal transceiving node SOUT. Signal selection at the multiplexor may be controlled via control signal applied to to control node SEL that may be connected to a selection input of the multiplexor 460.

In operation, when a low signal is applied to control node SEL, receiver 450 may be de-activated and multiplexor may pass a signal at input port 464 to its output port 468. If control signal TX is also low, then differential signal circuitry 330 may be configured to receive a signal at transceiving node SOUT and provide the signal to integrated circuitry on the substrate 305 via node CHP. If control signal TX is high, then differential signal circuitry 330 may be configured to receive a signal at input node SIG (e.g., from on-chip circuitry) and provide differential signals to signal transceiving nodes TRX1, TRX2, and provide an amplified version of the received signal to signal transceiving node SOUT and to node CHP.

If a high signal is applied to control node SEL, receiver 450 may be activated and the multiplexor 460 may pass a signal at input port 462 to its output port 468. If control signal TX is low, then differential signal circuitry 330 may be configured to receive differential signals at transceiving nodes TRX1, TRX2, and provide a signal derived from the differential signals to output amplifier 320 and to integrated circuitry on substrate 305 via node CHP. If control signal TX is high, then differential signal circuitry 330 may be configured to provide differential signals produced by inverting and non-inverting amplifiers 404, 406 from a signal received from input signal node SIG to receiver 450 and to differential transceiving nodes TRX1, TRX2. In turn, receiver 450 may provide a signal derived from the differential signals produced by inverting and non-inverting amplifiers 404, 406 to output amplifier 320 and integrated circuitry on substrate 305 via node CHP.

Figure 12A:
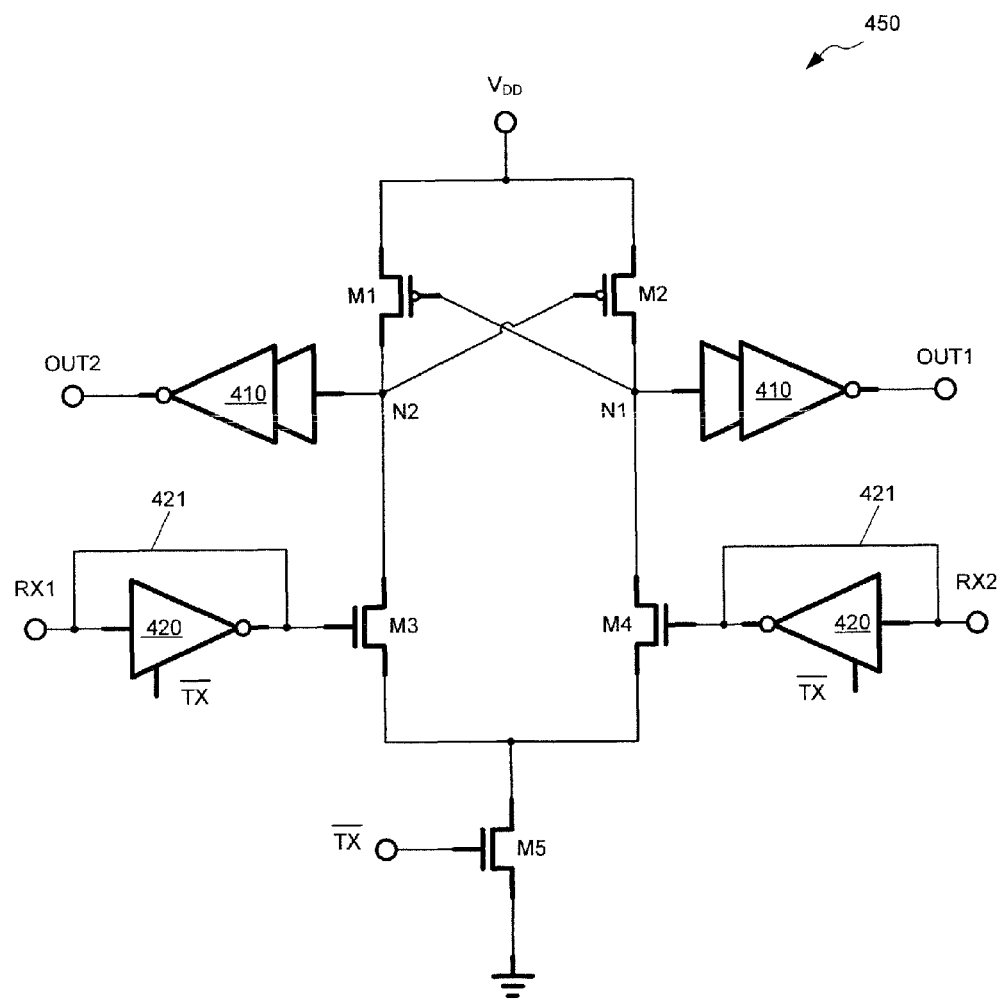
FIGS. 12A and 12B illustrate embodiments of receiving circuitry that may be used in conjunction with the contactless differential pads.
Figure 12B:
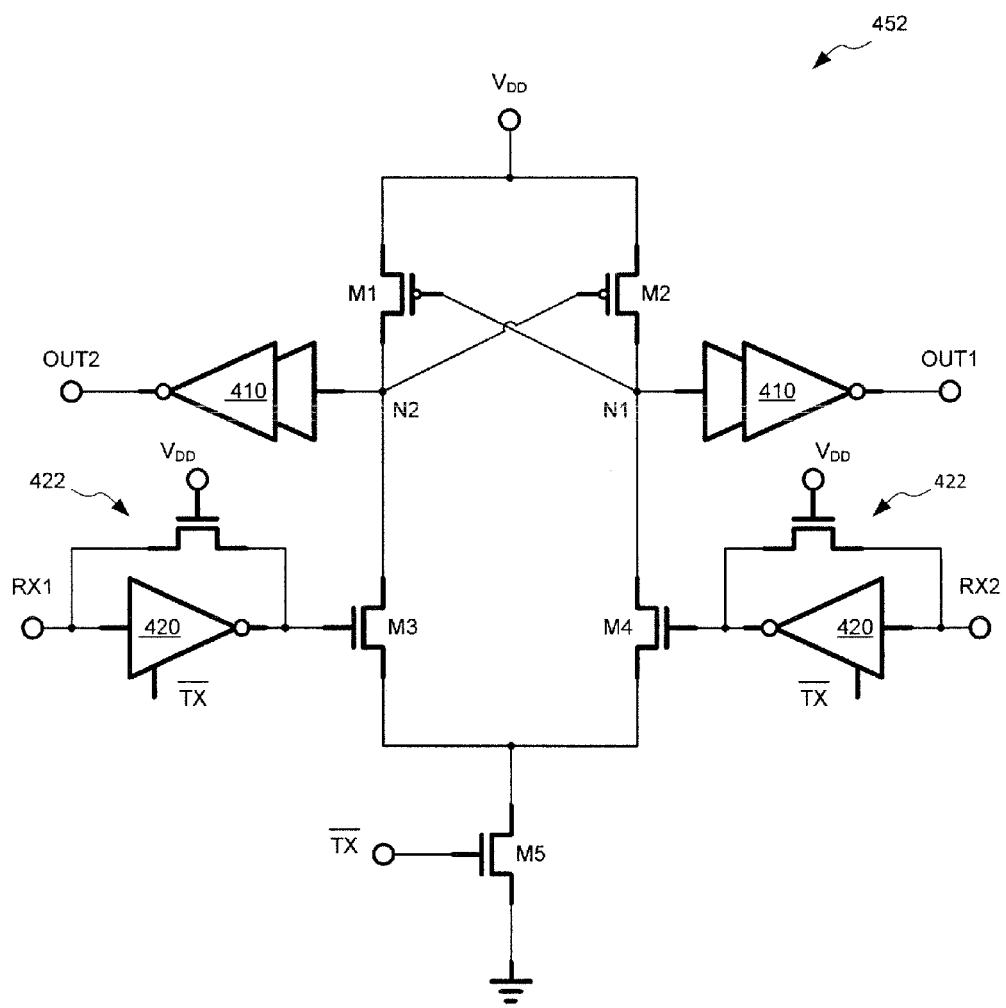

One embodiment of receiver 450 is depicted in FIG. 12. Receiver 450 may comprise transistors arranged in a latching differential amplifier configuration and optionally include additional amplification circuitry. The receiver 450 may be used to recover a DC component of digital signals received via the differential I/O pads. In some embodiments, the receiver may comprise transistors M1, M2 of a first type and transistors M3, M4, M5 of a second type connected in a differential amplifier configuration as shown. The transistors of the first type may be PMOS transistors and the transistors of the second type may be NMOS transistors, though other kinds (BJTs, JFETs, etc.) and reversed types of transistors may be used as would be understood by one skilled in the art. According to some embodiments, transistors M1 and M2 may be replaced by resistors, and transistor M5 may be replaced by a voltage-controlled or current-controlled current source.

According to one embodiment, the receiver 450 comprises first and second parallel circuit branches of a differential amplifier. In the first branch, a first transistor M1 of a first type may have its main current terminals connected in series with main current terminals of a second transistor M3 of a second type. In the second branch, a third transistor M2 of a first type may have its main current terminals connected in series with main current terminals of a fourth transistor M4 of a second type. The first and second branches may be connected at one end to a first potential (e.g., a first supply $V_{DD}$). The first and second branches may be connected at another end to a first main current terminal of a fifth transistor M5. A second main current terminal of transistor M5 may be connected to a second potential (e.g., ground or a second supply).

A control terminal of the first transistor M1 may be connected to a first node N1 of the second circuit branch that is between the third M3 and fourth M4 transistors. A control terminal of the third transistor M2 may be connected to a second node N2 of the first circuit branch that is between the first M1 and second M2 transistors. Control terminals of transistors M3, M4 may be configured to receive input differential signals that are to be amplified by the receiver. The input differential signals may be received from transceiving nodes TRX1, TRX2, for example. A control terminal of the fifth transistor M5 may be connected to a control signal $\overline{TX}$ that enables or disables operation of the differential amplifier. Control signal $\overline{TX}$ may be of opposite polarity compared to control signal TX.

Nodes N1, N2 may be connected to output nodes OUT1, OUT2 that each provide an amplified output signal based upon signals received at input transistors M3, M4. A signal from node OUT1 may be of opposite polarity compared to a signal from node OUT2. One or more output amplifiers 410 (e.g., pairs of inverting amplifiers) may be used at each output OUT1, OUT2. One or more input amplifiers 420 may be used at each input RX1, RX2. In one embodiment, input amplifiers 420 comprise inverting amplifiers that can be enabled or disabled by control signal $\overline{TX}$. In some embodiments, one or both of amplifiers 410 may be omitted or replaced with other suitable types of amplifiers. In some embodiments, input amplifiers 420 may be omitted or replaced with other suitable types of amplifiers. Other types of amplifiers may include transistors connected in a common emitter amplifier configuration and operational amplifiers.

According to some embodiments, each input amplifier 420 may be connected in parallel with a shunt 421 or a resistance (not shown). According to some embodiments, shunts 421 may be replaced with one or more transistors 422 coupled across each inverting amplifier to 420, as shown in the transceiver 452 of FIG. 12B, for example. The shunts 421, resistors, or transistors coupled across the amplifiers 420 may be used to provide self-biasing of the inverting amplifiers. According to some embodiments, the shunts 421, resistors, or transistors coupled across the amplifiers 420 may be used to provide a full swing of the differential signals. In some embodiments, transistors and/or resistors may be used to limit the voltage swing of the inverting amplifiers 420.

In operation, receiver 450 or 452 may be activated when signal TX goes low and $\overline{TX}$ goes high. A high signal $\overline{TX}$ would turn transistor M5 on to act as a current source, and would activate inverting amplifiers 420. When the inverting amplifiers 420 are activated, the polarity of an amplified signal at the first output OUT1 will track the polarity of a signal applied to input node RX1. According to some embodiments and referring again to FIG. 11, differential signals appearing at nodes TRX1, TRX2 may be applied to input nodes RX1 and RX2. A signal generated at the first output OUT1 may be applied to one input of multiplexor 460. The second output OUT2 of receiver 450 or 452 may or may not be used. When selected, multiplexor may provide the signal from the receiver output OUT1 458 to on-chip circuitry via node CHP.

Also contemplated are methods for fabricating the coupling structure shown in FIG. 10B, and methods processing signals in accordance with the circuitry of FIGS. 11 and 12.

A method of fabricating the coupling structure shown in FIG. 10B may follow any of the methods described above in connection with fabricating structures such as those shown in FIGS. 1-7. Any of these methods may include a step of patterning at least two differential pads 362, 364 formed in a closely-spaced pair and configured to mate with a corresponding pair of differential pads or probes that may be located on a separate substrate or structure. The at least two differential pads 362, 364 may be located within 50 microns of each other in some embodiments, within 20 microns of each other in some embodiments, within 10 microns of each other in some embodiments, within 5 microns of each other in some embodiments, within 2 microns of each other in some embodiments, and yet within 1 micron of each other in some embodiments. The method may include forming interconnections to the differential pads, wherein the interconnections provide for the application of differential signals to the differential pads.

Figure 13A:
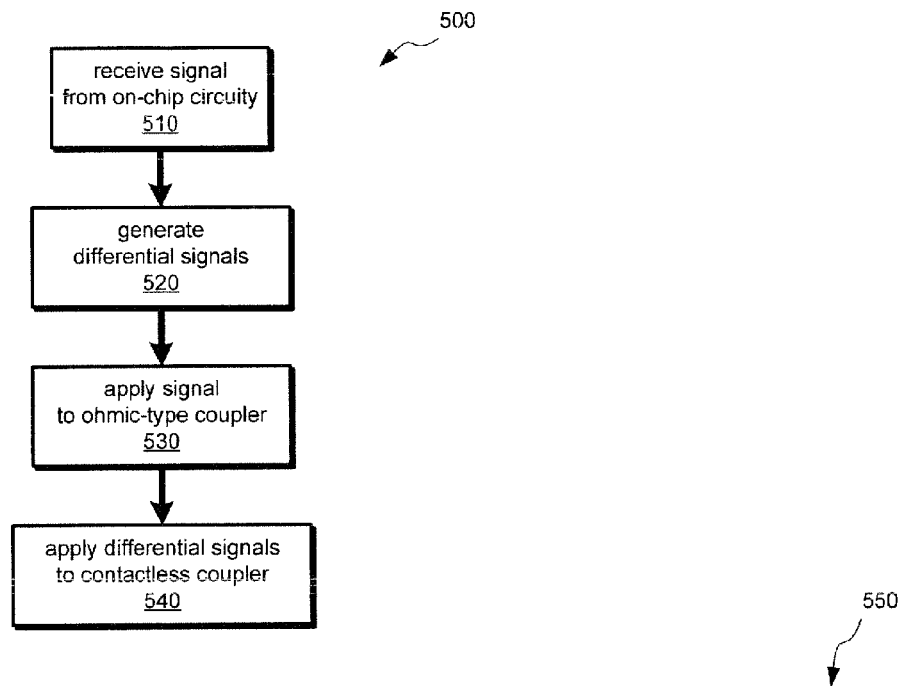
FIGS. 13A and 13B depict methods associated with contactless differential coupling of signals from circuitry on one substrate to circuitry on another substrate or probing device.
Figure 13B:
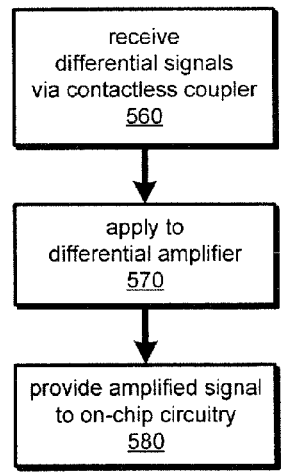

Associated with the circuitry of FIGS. 11 and 12 may be a method 500 for providing to differential signals for contactless coupling between a first wafer or chip and a circuit external to the wafer or chip, and a method 550 for receiving differential signals via contactless differential pads. Some embodiments of these methods are depicted in FIGS. 13A and 13B.

A method 500 for providing differential signals may comprise a step of receiving 510, at the first wafer or chip, a first signal to be transmitted to a circuit external to the first wafer of chip. The first signal may be a signal generated by circuitry integrated on the first wafer or chip. The method 500 may further include generating 520 differential signals from the first signal. The differential signals may be produced such that a difference between the differential signals is representative of the first signal. For example, the first signal may be applied to inputs of a non-inverting and an inverting amplifier configured in parallel circuit branches, and the outputs of the non-inverting and inverting amplifiers constitute differential signals.

The method 500 may further include applying 530 a signal representative of the received signal to an ohmic-type contact pad 355 that may be part of a coupling structure between a first substrate and a second substrate or probe. The act of applying 530 a signal representative of the received signal to an ohmic-type contact pad may not be included in the method 500 in some embodiments. The method 500 may further include applying 540 the differential signals to a contactless coupler comprising a pair of differential pads. The contactless coupler may be a structure described above in connection with FIG. 10B.

A method 550 for receiving differential signals via contactless coupling is also contemplated as being within the scope of the invention. The method 550 for receiving differential signals may comprise receiving 560, at receiving nodes on a wafer or chip, differential signals from a signal source that is off chip or off wafer via a contactless coupling structure comprising a pair of differential pads. The contactless coupler may be a structure described above in connection with FIG. 10B. The method 550 may further include applying 570 the received differential signals to a differential amplifier or other signal processing circuitry that generates an output signal derived from the differential signals. In various embodiments, the differential amplifier or signal processing circuitry is located on the wafer or chip. The output signal may be amplified in some embodiments. The method 550 may further include providing 580 the output signal to on-chip or on-wafer circuitry.

As will be appreciated by those skilled in the art, the contact and contactless couplers described above will be useful for a variety of applications. For example, the couplers and coupling structures described above will be useful for multi-chip circuit assemblies, e.g., to assemblies such as the one depicted in FIG. 8. The couplers and coupling structures described above may also be useful in wafer-testing or device-testing applications. For example, temporary coupling to a chip or wafer may be achieved via the contact or contactless coupling structures for testing apparatus that uses probe cards and interposers.

From an examination of the various characteristics of the invention obtained according to the present disclosure the advantages that it affords are evident.

In particular, embodiments enable a considerable saving of area of the substrates used in so far as conductive bumps can be formed in any region of the substrate, in particular positions corresponding to the conductive pads. In this way, the bumps have at the same time the function of mechanical supporting elements and the function of contact electrical coupling elements (the bumps ohmically connected to the respective pads) or contactless electrical coupling elements (the bumps capacitively connected to the respective pads).

Furthermore, the manufacturing process is compatible with standard CMOS processes.

Furthermore, the use of capacitive interconnections enables limitation of the use of electrostatic-discharge (ESD) protection elements, which occupy space and limit the performance of the device. The absence of ESD protection elements also enables reduction of the power consumption levels.

Finally, it is clear that modifications and variations may be made to the invention described and illustrated herein, without thereby departing from the sphere of protection of the present invention, as defined in the annexed claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A coupling structure comprising:
   a first substrate;
   a first differential pad and a second differential pad arranged as a pair and coupled to the first substrate;
   an insulating layer having opposing top and bottom surfaces, the bottom surface coupled to the first and second differential pads;
   a first mating differential pad and a second mating differential pad arranged as a pair and coupled to the top surface of the insulating layer, the first and second mating differential pads being aligned with the first and second differential pads, respectively;
   a circuit connected to the first and second differential pads and configured to provide differential signals based upon a first signal to the first and second differential pads, the circuit comprising
   an input amplifier having an output,
   differential signal circuitry coupled to the output of the input amplifier, and
   an output amplifier having an input coupled to the differential signal circuitry,
   an ohmic-type contact pad coupled to the first substrate and configured to receive a second signal representative of the first signal; and
   a mating ohmic-type contact pad in direct ohmic contact with the ohmic-type contact pad.

2. The coupling structure of claim 1, further comprising a second substrate carrying the first and second mating differential pads adjacent the first substrate.

3. The coupling structure of claim 1, further comprising a probing device carrying the first and second mating differential pads adjacent the first substrate.

4. The coupling structure of claim 1, further comprising a second substrate carrying the mating ohmic-type contact pad adjacent the first substrate.

5. The coupling structure of claim 1, further comprising a probing device carrying the mating ohmic-type contact pad adjacent the first substrate.

6. The coupling structure of claim 1, wherein the first differential pad is located within 50 microns of the second differential pad.

7. The coupling structure of claim 1, wherein the first and second differential pads comprise conductive material.

8. The coupling structure of claim 1, wherein the input amplifier has an input coupled to a signal receiving node, the signal receiving node for receiving a signal to be transmitted via the first and second differential pads; and wherein the differential signal circuitry comprises a non-inverting amplifier having an input coupled to the output of the input amplifier and an output coupled to a first transceiving node, and an inverting amplifier having an input coupled to the output of the input amplifier and an output coupled to a second transceiving node.

9. The coupling structure of claim 8, wherein the first transceiving node is connected to the first differential pad and the second transceiving node is connected to the second differential pad.

10. The coupling structure of claim 8, wherein the differential signal circuitry comprises
    a receiver having a first receiving input connected to the first transceiving node and a second receiving input connected to the second transceiving node;
    a multiplexor having a first input; and
    an output connected to the first input of the multiplexor.

11. The coupling structure of claim 10, wherein the multiplexor has a second input configured to receive a signal representative of the first signal and an output configured to be connected to circuitry on the first substrate.

12. The coupling structure of claim 10, wherein the receiver comprises a differential amplifier configured to generate a signal based upon input signals received from the first and second transceiving nodes.

* * * * *